United States Patent
Muro et al.

(10) Patent No.: US 7,269,526 B2
(45) Date of Patent: Sep. 11, 2007

(54) AGGREGATED RUN-TO-RUN PROCESS CONTROL FOR WAFER YIELD OPTIMIZATION

(75) Inventors: Amelia Clara Muro, Hollister, CA (US); Andrew Crehan Walker, Carmel, CA (US); Yeak-Chong Wong, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 11/123,609

(22) Filed: May 4, 2005

(65) Prior Publication Data
US 2006/0265162 A1 Nov. 23, 2006

(51) Int. Cl.
G01N 37/00 (2006.01)
G06F 19/00 (2006.01)
(52) U.S. Cl. ..................................................... 702/84
(58) Field of Classification Search .............. 702/81–84; 427/569; 700/95, 109, 121
See application file for complete search history.

(56) References Cited

U.S. PATENT DOCUMENTS

| | | | |
|---|---|---|---|
| 4,238,312 A | 12/1980 | Galicki et al. ............ 204/298 |
| 5,639,309 A * | 6/1997 | Akimoto ............... 118/723 MP |
| 6,389,366 B1 | 5/2002 | Heavlin ............... 702/84 |
| 6,605,521 B2 | 8/2003 | Ajmera et al. ............ 438/296 |
| 2002/0199082 A1 | 12/2002 | Shanmugasundram et al. .. 712/208 |
| 2005/0266173 A1* | 12/2005 | Brcka ............... 427/569 |

OTHER PUBLICATIONS

Kil-Soo Kim and Bong-Jin Yum, "Control Charts for Random and Fixed Components of Variation in the Case of Fixed Wafer Locations and Measurement Positions," May 1999, IEEE Transactions on Semiconductor Manufacturing, vol. 12, No. 2.
H.J.A. Rulkens, E.J.J. van Campen, J.van Herk, and J.E. Rooda, "Batch Size Optimization of a Furnace and Pre-Clean Area by Using Dynamic Simulations," 1998, IEEE/SEMI Advanced Semiconductor Manufacturing Conference.

* cited by examiner

*Primary Examiner*—Michael P. Nghiem
(74) *Attorney, Agent, or Firm*—Zilka-Kotab, PC

(57) ABSTRACT

A method for processing wafers in a batch processing tool that optimizes yield by minimizing within batch wafer variation in a wafer process. In a tool having a plurality of available wafer positions for a batch process, the method is useful when less than a full batch of wafers is to be processed. All of the possible wafer position combinations are determined and the within batch variation for each position combination is determined. The wafer position combination resulting in the least amount of within batch variation in the wafer process is then selected as the wafer placement combination for use in the process.

10 Claims, 6 Drawing Sheets

| Batch size | Combination | Total Number of Combinations |
|---|---|---|
| 1 | $^8C_1$ | 8 |
| 2 | $^8C_2$ | 28 |
| 3 | $^8C_3$ | 56 |
| 4 | $^8C_4$ | 70 |
| 5 | $^8C_5$ | 56 |
| 6 | $^8C_6$ | 28 |
| 7 | $^8C_7$ | 8 |
| 8 | $^8C_8$ | 1 |

FIG. 5

AGGREGATED RUN-TO-RUN PROCESS CONTROL FOR WAFER YIELD OPTIMIZATION

FIELD OF THE INVENTION

The present invention relates to wafer processing, and more particularly to a method for optimizing wafer throughput and production quality, by taking into account wafer placement within a processing tool.

BACKGROUND OF THE INVENTION

The last several decades have seen enormous advances in the development of micro-devices manufactured on wafers, such as Si wafers or TiC wafers. For example very large scale integrated circuits manufactured on silicon wafers have found a wide range of used devices such as computers, cell phones toys and myriad other consumer and commercial applications. In, magnetic heads for use in tape and disk drive systems are constructed on wafers, which are generally constructed of TiC. Typically thousands of such devices have been constructed a single wafer.

Such wafers are often processed in tools such as plasma chambers and sputter deposition chambers, plating baths, etc., with several such wafers being processed simultaneously. Although a great deal of expense goes into the design and fabrication of such wafers, and vast amounts of capital are invested the tooling to process these wafers, it is the ability to manufacture many thousands of such devices simultaneously that allows these devices to manufactured at a very low cost per unit.

Over the last several decades, as more and more companies have entered the market, the price margins on such devices have become extremely tight. Any process that can increase manufacturing throughput has a large effect on the viability of such a product. As can be appreciated, since many thousands of devices are manufactured simultaneously in the wafers processed within such tools, a certain percentage of devices produced in these tools will, for one reason or another, fall outside of manufacturing specifications, requiring that those devices be rejected. For example, deposition rate in a sputter deposition chamber may vary over time as a result of one or more parameters of the tool changing over time. Manufacturers therefore, use feedback protocols to adjust such process parameters over time between batches as batch to batch testing indicates that an unacceptable number of produced devices pass inspection.

Conventional run-to-run process control makes adjustment based on batch average data, the within batch variations being generally ignored. However, many batch processes have inherent within batch variation, such as due to spatial effects within the processing tool. These batch processing tools include, for example, batch sputtering deposition chamber, chemical etching bath and vertical oxidation furnaces. Under such conditions the conventional run-to-run control makes bias prediction when spatial variation is present. The amount of estimation error from conventional run-to-run control depends on the magnitude of within batch variation, the batch size of each run and the placement of wafer in the batch. Furthermore, conventional run-to-run control does not utilize data feedback to minimize batch variation by optimizing wafer placement within the batch processing tool.

Furthermore, although such tools can process several wafers simultaneously, in many such tools operate with less than a full batch of wafers. By way of example, an ALCA-TEL-COMPTECH HEDA 2460 and 2480 ® alumina sputtering tool is a tool used in an alumina sputtering gap fill process. The tool is a batch processing tool with eight positions for wafer loading. The actual batch size of a run depends on wafer logistics in the manufacturing line. Only wafers that use the same processing recipe can be processed together within the batch. In a manufacturing environment having a high mix of wafer product types, batches are not always processed with full a full batch of eight wafers. Blanket wafers will be used to fill up the empty positions when there are less than eight product wafers that use the same recipe available.

As discussed above, current manufacturing techniques take into account batch-to-batch variations, but do not provide a means to monitor and minimize variations with a batch, such as from spatial arrangement within a tool. Therefore, there is strong felt need for a manufacturing process that can take into account within batch variations and provide a feedback mechanism to mitigate such variations. There also a strong felt need for such a process that can minimize within batch variations when less than a full batch of wafers is being processed.

SUMMARY OF THE INVENTION

The present invention provides system method and apparatus for increasing product yield by minimizing within batch wafer variation of batch wafer processing tool. The method is especially useful when less than a full batch of wafers is to be processed. In a batch processing tool having a plurality of available wafer positions, a determination of possible wafer placement combinations is made. Then, the optimized process parameters and within batch variation for each wafer placement combination is made. The wafer placement combination having the least amount of within wafer variation is then selected as the placement combination for use in processing the wafers.

The present invention advantageously increases yield by minimizing the within wafer variation, thereby decreasing the number of scrapped products produced on the wafer. The invention also advantageously requires little added expense and tooling to achieve this yield increase.

Various algorithms can be used in determining the placement combination having the least amount of within batch variation, and the algorithm chosen may depend on the type of process being performed in the chamber.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

FIG. 5 is a graphical representation of wafer variation for a plurality of wafer combinations in a tool.

BEST MODE FOR CARRYING OUT THE INVENTION

The following description is of the best embodiments presently contemplated for carrying out this invention. This description is made for the purpose of illustrating the general principles of this invention and is not meant to limit the inventive concepts claimed herein.

Figure 1:
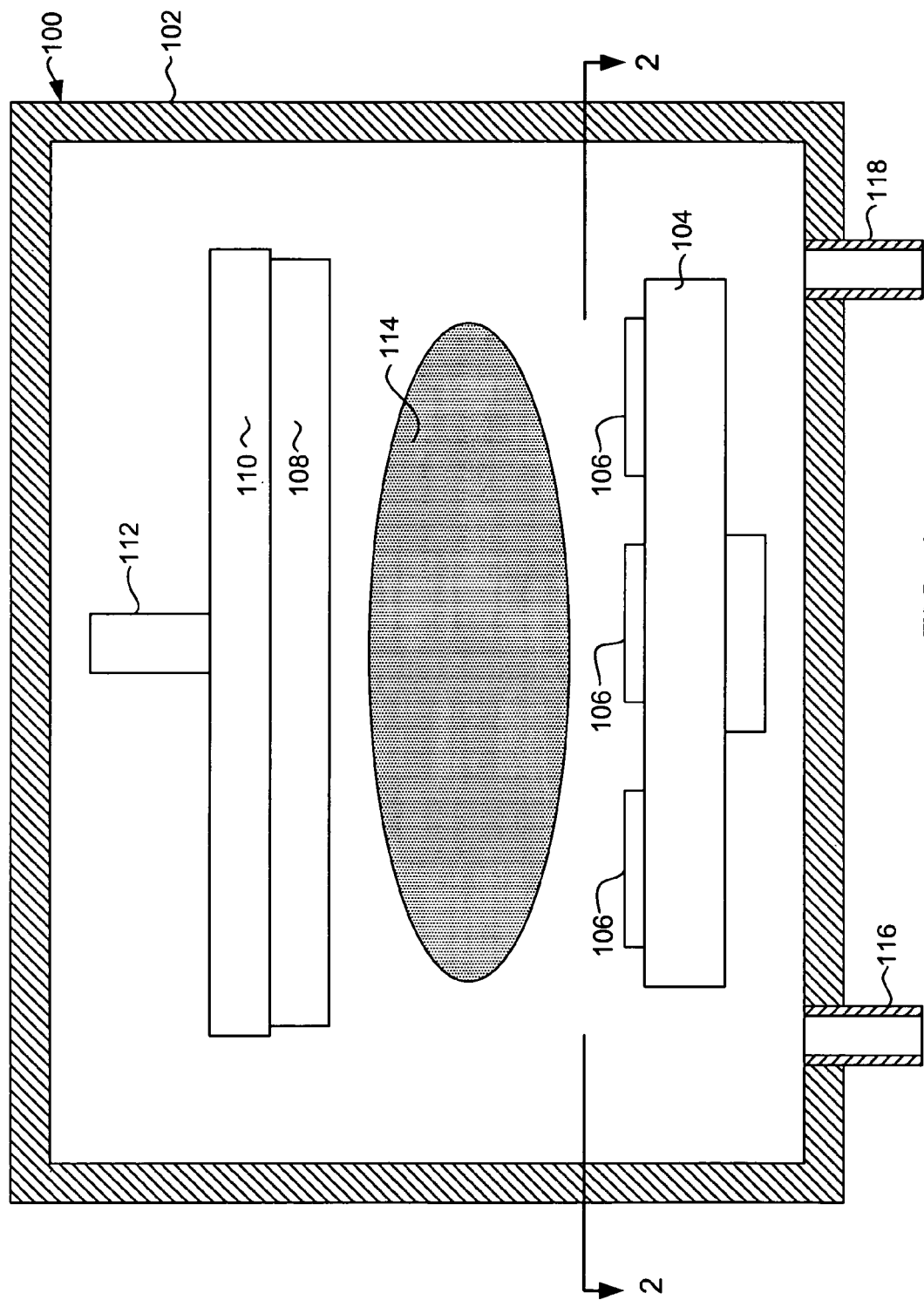
FIG. 1 is a cross sectional schematic illustration of a wafer processing tool in which a plurality of wafers may be processed.

Referring now to FIG. 1, there is shown a sputter deposition tool 100. It should be pointed out that the sputter deposition tool 100 is described for purposes of example, and that the present invention could be practiced in many other different types of wafer processing tools. The sputtering tool includes a chamber 102, and a chuck 104 mounted with the chamber. The chuck 104 is configured to hold a plurality of wafers 106 within the chamber 102. The chamber 102 also contains a sputter target 108 formed of a material that is desired to be sputter deposited, and an electrode 110 for providing a bias voltage for accelerating ions within the chamber 102. An RF signal generating antenna 112 is provided within the chamber 102 for striking plasma 114 within the chamber 102. The plasma 114 is formed from a desired gas atmosphere within the chamber which enters the chamber through an inlet 116, and exits the chamber through an outlet 118.

The plasma 114 generated within the chamber 102 includes positive and negatively charged ions. The bias voltage provided by the electrode 110 causes these ions to strike the target with sufficient energy to dislodge atoms of the target material. These atoms then travel toward the chuck 104 where they are deposited onto the wafers 106. As can be seen in FIG. 1, the various wafers 106 have different spatial relationships relative to the target 108. These differing spatial relationships cause the deposited material from the target to be deposited on the wafers 106 at different rates, both between the wafers and within a wafer depending on the angle and distance of a location of a wafer relative to the target 108.

Figure 2:
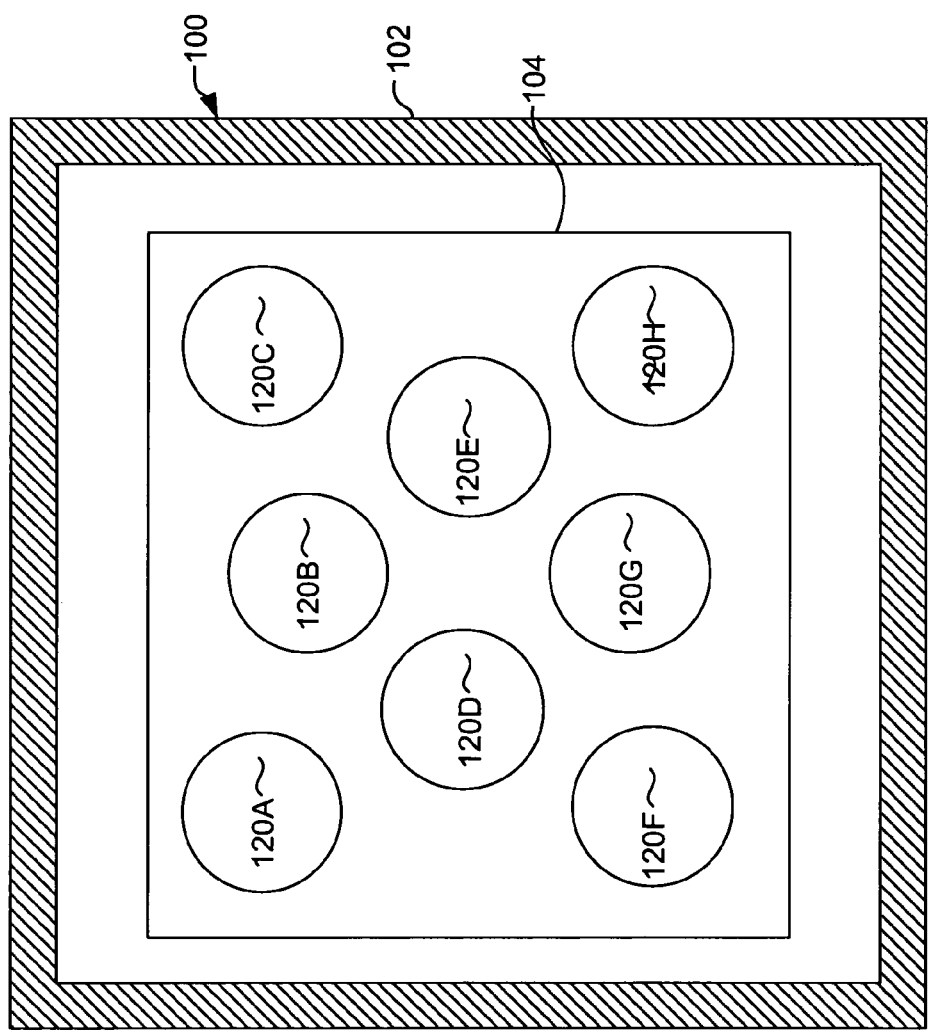
FIG. 2 is a view, taken from line 2-2 of FIG. 1 showing a possible plurality of available wafer positions within the processing tool.

FIG. 2, an example of an arrangement of wafers 106 on the chuck 104 within the tool 100 can be seen. For purposes of example only, the tool 100 illustrated in FIGS. 1 and 2 has 8 wafer positions 120A-120H to be processed simultaneously. The wafer positions 120A-120H ensure a necessary minimum spacing between adjacent wafers 106, while also allowing a maximum number of wafers 106 to be simultaneously manufactured. However, as discussed in above in the Background of the Invention, in many circumstances not all of the wafer positions will be filled during a batch run of the tool. As a result of manufacturing logistics, there may be occasions when less than the maximum number of wafers 106 will be processed.

According to the present invention, both within batch variations and between batch variations in a wafer manufacturing process are observed over time. To maximize yield it is desirable to minimize these manufacturing variations. Using the example of the sputtering chamber 100 as an example, the within batch variations are caused by spatial effects within the tool, whereas the between batch variation can be caused by, for example, the consumption of target and the change of vacuum chamber conditions over time.

Figure 3:
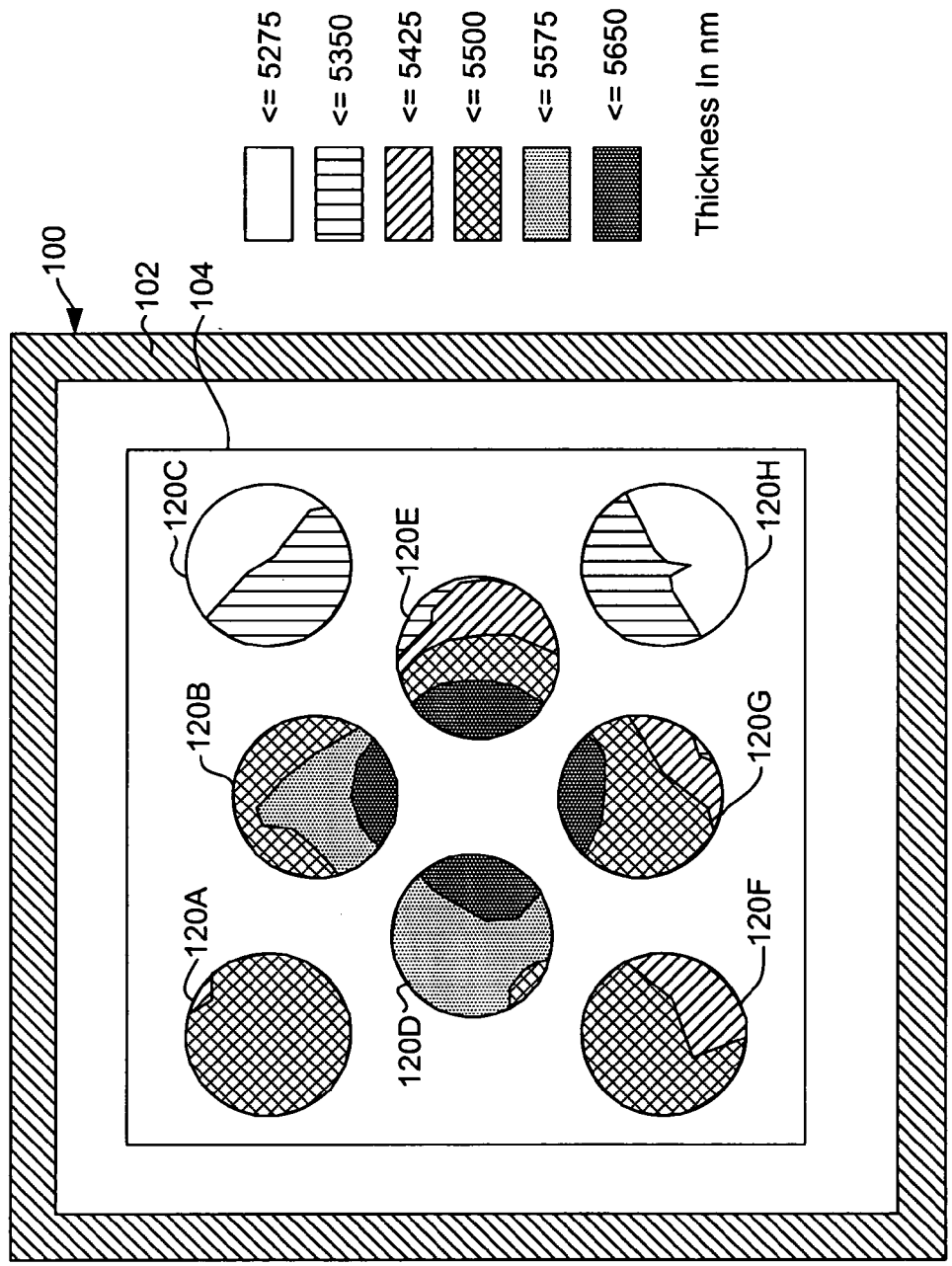
FIG. 3 is an illustration of possible wafer processing variation within a tool.

With reference to FIG. 3, a graph illustrating an example of within batch variations shows a tool such as the sputtering tool 100 having all of the wafer positions 120A-120H filled with wafers 106. The graph in FIG. 3 shows, by way of example, the deposition of alumina on wafers 106 at each of the wafer positions 120A-120H in the tool 100, and as can be seen the amount of alumina deposited on the wafers 106 depends on the location within the tool 100. What's more the variation is not as simple as having a deposition thickness that decreases with increased distance from the center of the chamber 100. Other factors, such as perhaps the flow of atmosphere within the chamber create a more complex spatial variation of process results. The variation of the thickness of each wafer taken as a whole can be described by the following table.

| Position | Average Thickness in (nm) | Standard Deviation of Thickness in (nm) |
| --- | --- | --- |
| 1 | 5431.69 | 21.10 |
| 2 | 5450.75 | 69.31 |
| 3 | 5273.21 | 33.43 |
| 4 | 5546.27 | 48.86 |
| 5 | 5413.39 | 82.92 |
| 6 | 5467.08 | 21.97 |
| 7 | 5509.68 | 59.49 |
| 8 | 5280.49 | 40.31 |

By understanding the spatial effects within the tool, the variation between wafers within the tool 100 can be minimized when less than all of the available positions are filled with wafers. When less than a full load of wafers is processed by the tool 100, the wafers being processed can be arranged in such a way as to minimize the variations within and between the wafers.

The present invention provides a run-to-run control method that takes into account all of the available data, including spatial information to deal with batch process inherent characteristics where spatial variation cannot be eliminated. It will provide an unbiased prediction of tuning parameters and generate an optimized wafer placement plan for minimizing-total variability. This method can be generalized and implemented to all batch processes that have large spatial variation where conventional run-to-run control is not good enough to minimize process variation.

The method will perform optimization based on all available data and consider the spatial information in the data set. The metrology data with spatial information will provide continued feedback to an Advanced Process Control (APC) system to perform run-to-run control. The run-to-run adjustment will minimize run-to-run variation of the product. The system will utilize the run-to-run tuning parameters to generate the best wafer placement plan for a batch based on batch size input. The total within batch variation will be minimized when the best wafer placement plan is being used for wafer processing. The objective function of the optimization can also be modified by assigning different weight factors for wafer-to-wafer and within wafer variation based on the quality criterion from customer or downstream operations.

Figure 4:
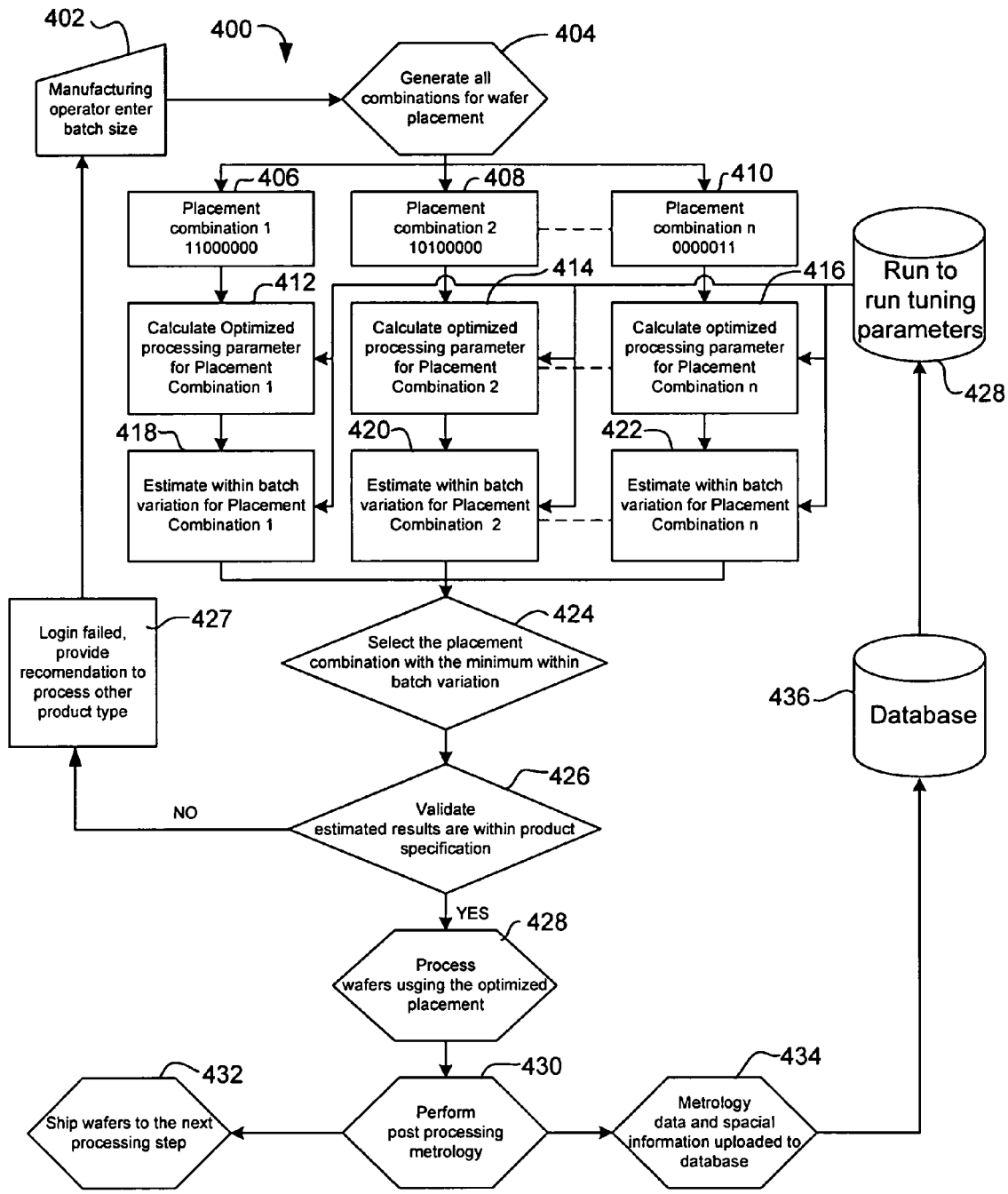
FIG. 4 is a flow chart illustrating a possible method for determining an optimal wafer placement combination for minimizing within batch wafer variation.

With reference now to FIG. 4, a flowchart illustrating method 400 for minimizing within batch variation of wafer processing. This method can be performed by a computer program, which can reside on a computer readable medium, such as a hard drive, tape drive floppy disk, compact disk (CD), digital video disk (DVD), flash card or any other computer readable memory. In a step 402 an operator can enter a batch size. This is the number of wafers to be processed in the batch. Using this information, in a step 404, all of the possible combinations of wafer placement are generated. These wafer placement possibilities are output as placement combination 1 (406), placement combination 2 (408), etc. up to placement combination n (410) where n is the number of possible combinations possible with the available number of positions and number of wafers to be processed.

In steps 412, 414, 416, the optimized process parameters are then calculated for each combination, and then, in steps 418, 420, 422, the within batch variation for each placement combination is calculated. Then, in step 424, the placement combination with the minimum within batch variation is selected. In a decision step 426, a determination is made as to whether the estimated results are within product specifications. If the answer to decision step 426 is no, the login has failed. In that case, a recommendation is generated to process another product type. If the answer to 426 is yes, the wafers are processed in step 428.

If the answer to 426 is yes, and the wafers have been processed in step 428, then, post processing metrology is performed on the manufactured wafers in step 430. The processed wafers are then shipped to the next processing step 432, and the metrology data and spatial information are uploaded 434 to a database 436. This data is then stored as run-to-run tuning parameters (Estimated deposition rate: $R_1$ through $R_n$, and estimated within-wafer-thickness standard deviation: $s_1$ through $s_n$) 438. The tuning parameters 438 are fed back to facilitate the calculation of optimized process parameters 412, 414, 416, and the estimation of within batch variation 418, 420, 422.

The following equations can be used to performing the run-to-run estimation and optimization (steps 406-422 in FIG. 4) to generate the best wafer placement plan within a batch for a given batch size. In these equations L is a wafer placement indicator. With a wafer loaded in a particular position "L"=1. With no wafer, L=0. "R" is the deposition rate, and "n" is the run number. The symbol "i" represents the position number (spatial index), "p" is the total number of positions available within the batch, and "$R_{(i,n)}$" is the rate in the (i)th position on for (n)th run.

Optimized Deposition Time can be calculated based on optimized predicted batch rate for a given batch:

$$R = \frac{\text{Thickness}}{\text{Time}}$$

For the nth run:

$$\hat{R}_{b,n} = \frac{\sum_{i=1}^{p}\left(\hat{R}_{i,n} \times L_{i,n}\right)}{\sum_{i=1}^{p} L_{i,n}}$$

$\hat{R}_{b,n}$=optimized predicted deposition rate for the nth run $\hat{R}_{i,n}$=predicted deposition rate for nth run ith position (EWMA statistics)

$R_{i,n}$=the actual deposition rate for the ith position based on data from the nth run $\hat{R}_{i,n+1}$ will be predicted independently based on data feedback.

When there is a wafer in the actual ith position:

$$\hat{R}_{i,n+1} = (1-\lambda) \times R_{i,n} + \lambda \times \hat{R}_{i,n}$$

When there is no actual data to determine $R_{i,n-1}$, then $$\hat{R}_{i,n+1} = (1+\lambda) \times \hat{R}_{i,n}^{unknown} + \lambda \times \hat{R}_{i,n}.$$

There is a situation where a position has not been used for several batches. To deal with this situation, one can use the "change in rate" to estimate the deposition rate for the position that has not been used. The average change in Deposition Rate $\widehat{\Delta R_n}$ can be estimated by using information from a position with a wafer.

$$\widehat{\Delta R_n} = \frac{\sum_{i=1}^{p}\left(R_{i,n} - \hat{R}_{i,n}\right) \times L_{i,n}}{\sum_{i=1}^{p} L_{i,n}}$$

Therefore, for a position with no actual wafer in nth run, deposition rate based on thickness data feedback can be:

$$\hat{R}_{i,n+1} = (1-\lambda) \times \hat{R}_{i,n}^{unknown} + \lambda \times \hat{R}_{i,n}$$
$$= (1-\lambda) \times \left(\hat{R}_{i,n} + \widehat{\Delta R_n}\right) + \lambda \times \hat{R}_{i,n}$$
$$= \hat{R}_{i,n} + (1-\lambda)\widehat{\Delta R_n}$$

To summarize, a list of useful equations is:
For wafer position with safer, $L_{i,n}$=1

$$\hat{R}_{i,n-1} = (1-\lambda) \times R_{i,n} + \lambda \times \hat{R}_{i,n}$$

Average change in Deposition rate $\widehat{\Delta R_n}$ is, $$\widehat{\Delta R_n} = \frac{\sum_{i=1}^{p}\left(R_{i,n} - \hat{R}_{i,n}\right) \times L_{i,n}}{\sum_{i=1}^{p} L_{i,n}}$$

For a position without a wafer, $L_{i,n}=0$ $$\hat{R}_{i,n+1} = \hat{R}_{i,n} + (1-\lambda)\hat{\Delta R_n}$$

Optimized rate prediction and processing time for the next batch is:

$$\hat{R}_{b,n+1} = \frac{\sum_{i=1}^{p}\left(\hat{R}_{i,n+1} \times L_{i,n+1}\right)}{\sum_{i=1}^{p} L_{i,n+1}}$$

$$\overline{Time_{b,n+1}} = \frac{TGT(\text{Thickness})}{\hat{R}_{b,n+1}}$$

Where TGT(Thickness) denotes target thickness of the given product wafer.

Sigma prediction for the ith position is:

For a position with a wafer, $L_{i,n}=1$ $$\hat{s}_{i,n+1} = (1-\lambda) \times s_{i,n} + \lambda \times \hat{s}_{i,n}$$

average change in standard deviation $\hat{\Delta s_n}$ is:

$$\hat{\Delta s_n} = \frac{\sum_{i=1}^{p}\left(s_{i,n} - \hat{s}_{i,n}\right) \times L_{i,n}}{\sum_{i=1}^{p} L_{i,n}}$$

For a position without a wafer, $L_{i,n}=0$ $$\overline{s_{i,n+1}} = \hat{s}_{i,n} + (1-\lambda)\hat{\Delta s_n}$$

Total batch variation for n+1 run including two components (1) within-wafer variation and (2) wafer-to-wafer variation:

$$\hat{\sigma}_T^2 = \overline{\sigma_{WTW}^2} + \overline{\sigma_{WTW}^2}$$

(1) within-wafer variation, calculated is calculated based on the average of the estimated standard deviation:

$$\overline{\sigma_{WTW}^2} = \left(\frac{\sum_{i=1}^{p} \hat{s}_{i,n+1} \times L_{i,n+1}}{\sum_{i=1}^{p} L_{i,n+1}}\right)^2$$

(2) wafer-to-wafer variation (estimated thickness for the ith position ith position for example):

$$\overline{Thickness_{i,n+1}} = \hat{R}_{i,n+1} \times \overline{Time_{b,n+1}}$$

A generic equation to calculate standard deviation of x can be:

$$\hat{\sigma}^2 = \frac{\sum_{i=1}^{n}(x_i - \bar{x})^2}{n-1}$$

And, x can be replaced with $\overline{Thickness_{i,n-1}}$ in the above equation, $$\bar{x} = \overline{thickness_b} = \frac{\sum_{i=1}^{p} \hat{R}_{i,n+1} \times \overline{Time_{b,n+1}} \times L_{i,n}}{\sum_{i=1}^{p} L_{i,n}}$$

$$\overline{\sigma_{WTW}^2} = \frac{\sum_{i=1}^{p}\left(\hat{R}_{i,n+1} \times \overline{Time_{b,n+1}} - \overline{thickness_b}\right)^2}{\sum_{i=1}^{p} L_{i,n} - 1}$$

The total within batch variation can be calculated using the following equation and the placement combination with minimum total within batch variation will be used for actual wafer processing.

$$\min\left[\hat{\sigma}_T^2\right] = \min\left[\overline{\sigma_{WTW}^2} + \overline{\sigma_{WTW}^2}\right]$$

$$= \min\left[\left(\frac{\sum_{i=1}^{p} \hat{s}_{i,n+1} \times L_{i,n+1}}{\sum_{i=1}^{p} L_{i,n+1}}\right)^2 + \frac{\sum_{i=1}^{p}\left(\hat{R}_{i,n+1} \times \overline{Time_{b,n+1}} - \overline{thickness_b}\right)^2}{\sum_{i=1}^{p} L_{i,n} - 1}\right]$$

Figure 6:
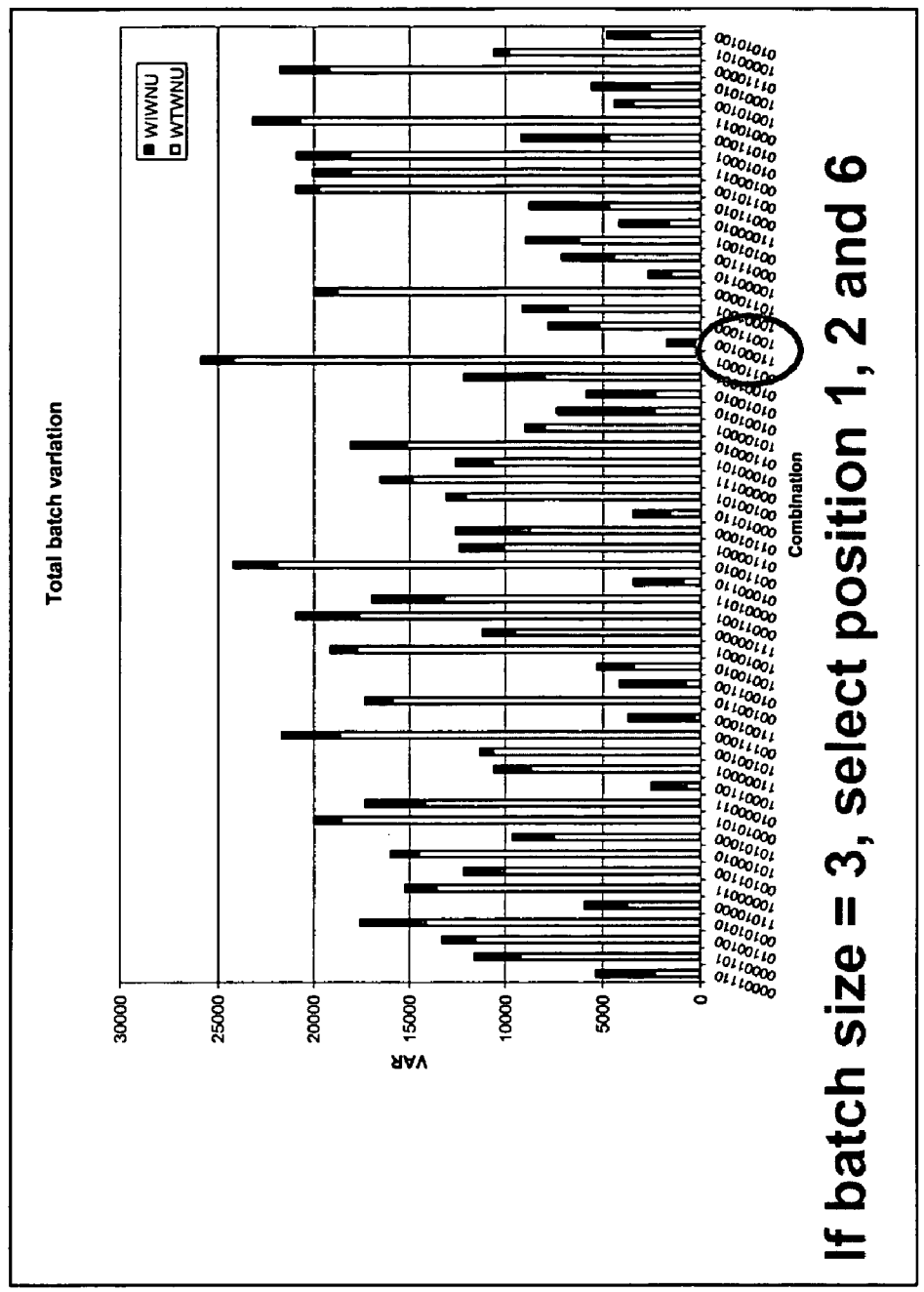
FIG. 6 is a bar graph showing variation for a batch of wafers.

By way of example, as illustrated in the table in FIG. 5, for a batch of 3 wafers available for processing in a tool with 8 possible positions, there are a total of 56 combinations for wafer placement. FIG. 6 shows the variation in within batch variation for an exemplary set of wafer placement combinations. As can be seen from this example, the variation can be significantly reduced by choosing the optimum wafer placement combination.

As can be seen from the above, the present invention provides a means for optimizing wafer yield by minimizing within batch variation when less than a full batch of wafers is being processed. The method involves negligible added expense and requires no additional tooling. While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for minimizing wafer process variation, comprising:
   determining a plurality of wafer placement combinations;
   calculating an optimized processing parameter for each of the plurality of wafer placement combinations;
   estimating within batch variation for each placement combination;
   selecting a placement combination having a minimum within batch variation;
   processing a batch of wafers using the selected placement combination having a minimum number of within batch variation;
   performing post processing metrology to collect post processing metrology data;
   storing the post processing metrology data in a database; and
   feeding back the post metrology data to facilitate the calculation of optimized process parameters for at least one placement combination.

2. A method as in claim 1 further comprising using the optimized process parameters to process a second batch of wafers.

3. A method for minimizing wafer process variation, comprising:
   determining a plurality of wafer placement combinations;
   calculating an optimized processing parameter for each of the plurality of wafer placement conbinations;
   estimating within batch variation for each placement combination;
   selecting a placement combination having a minimum within batch variation;
   processing a batch of wafers using the selected placement combination having a minimum her of within batch variation;
   performing post processing metrology to collect post processing metrology data;
   storing the post processing metrology data in a database; and
   feeding back the post metrology data to facilitate the estimation of within batch variation for at least one placement combination.

4. A method for minimizing wafer process variation, comprising:
   determining a plurality of wafer placement combinations;
   calculating an optimized processing parameter for each of the plurality of wafer placement conbinations;
   estimating within batch variation for each placement combination;
   selecting placement combination having a minimum within batch variation;
   processing a batch of wafers using the selected placement combination having a minimum number of within batch variation;
   performing post processing metrology to collect post processing metrology data;
   storing the post processing metrology data in a database; and
   feeding back the post metrology data to facilitate both the calculation of optimized process parameters and the estimation of within batch variation for at least one placement combination.

5. A method for minimizing wafer process variation, comprising:
   determining a plurality of wafer placement combinations;
   calculating an optimized processing parameter for each of the plurality of wafer placement combinations;
   estimating within batch variation for each placement combination;
   selecting a placement combination having a minimum within batch variation;
   processing a batch of wafers using the placement combination having a minimum number of within batch variation;
   performing post processing metrology to collect post processing metrology data;
   storing the metrology data in a database;
   retrieving the metrology data from the database;
   using the retrieved metrology data to facilitate the calculation of optimized process parameters and the estimation of within batch variation for at least one placement combination.

6. A computer software product embodied on a computer readable medium, comprising:
   code for determining a plurality of wafer placement combinations;
   code for calculating an optimized processing parameter for each of the plurality of wafer placement combinations;
   code for estimating within batch variation for each placement combination;
   code for selecting a placement combination having a minimum within batch variation;
   code for processing a batch of wafers using the placement combination having a minimum number of within batch variation;
   code for performing post processing metrology to collect post processing metrology data;
   code for storing the post processing metrology data in a database and
   code for feeding back the post metrology data to facilitate the calculation of optimized process parameters for at least one placement combination.

7. A method as in claim 6 further comprising code for using the optimized process parameters to process a second batch of wafers.

8. A computer software product embodied on a computer readable medium, comprising:
   code for determining a plurality of water placement combinations;
   code for calculating an optimized processing parameter for each of the plurality of wafer placement combinations;
   code for estimating within batch variation for each placement combination;
   code for selecting a placement combination having a minimum within batch variation;
   code for processing a batch of wafers using the placement combination having a minimum number of within batch variation;
   code for performing post processing metrology to collect pod processing metrology data;
   code for storing the post processing metrology data in a database and
   code for feeding back the post metrology data to facilitate the estimation of within batch variation for at least one placement combination.

9. A computer software product embodied on a computer readable medium, comprising:
- code for determining a plurality of wafer placement combinations;
- code for calculating an optimized processing parameter: for each of the plurality of wafer placement combinations;
- code for estimating within batch variation for each placement combination;
- code for selecting a placement combination having a minimum within batch variation;
- code for processing a batch of wafers using the placement combination having a minimum number of within batch variation;
- code for performing post processing metrology to collect post processing metrology data;
- code for storing the post processing metrology data in a database and
- code for feeding back the post metrology data to facilitate both the calculation of optimized process parameters and the estimation of within batch variation for at least one placement combination.

10. A computer software product embodied on a computer readable medium, comprising:
- code for determining a plurality of wafer placement combinations;
- code for calculating an optimized processing parameter for each of the plurality of wafer placement combinations;
- code for estimating within batch variation for each placement combination;
- code for selecting a placement combination having a minimum within batch variation;
- code for processing a batch of wafers using the placement combination having a minimum number of within batch variation;
- code for performing post processing metrology to collect post processing metrology data;
- code for storing the metrology data in a database;
- code for retrieving the metrology data from the database; and
- code for using the retrieved metrology data to facilitate the calculation of optimized process parameters and the estimation of within batch variation for at least one placement combination.

* * * * *